(12) United States Patent
Parris et al.

(10) Patent No.: US 6,515,926 B1
(45) Date of Patent: Feb. 4, 2003

(54) SHARED SENSE AMPLIFIER DRIVER TECHNIQUE FOR DYNAMIC RANDOM ACCESS MEMORIES EXHIBITING IMPROVED WRITE RECOVERY TIME

(75) Inventors: Michael C. Parris, Colorado Springs, CO (US); Kim C. Hardee, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 0 days.

(21) Appl. No.: 10/038,932

(22) Filed: Jan. 4, 2002

(51) Int. Cl.[7] .................................................. G11C 7/00
(52) U.S. Cl. .................... 365/205; 365/207; 365/189.05
(58) Field of Search ................................ 365/205, 207, 365/189.05, 189.01, 189.11

(56) References Cited

U.S. PATENT DOCUMENTS 6,154,404 A * 11/2000 Hwang ........................ 365/205

6,249,469 B1 * 6/2001 Hardee ........................ 365/205

* cited by examiner

*Primary Examiner*—David Lam
(74) *Attorney, Agent, or Firm*—William J. Kubida; Peter J. Meza; Hogan & Hartson LLP (57) ABSTRACT

A shared sense amplifier driver technique for integrated circuit devices including an array of memory cells comprises a plurality of sense amplifiers couplable to the memory cells with each of the sense amplifiers having an associated pull-up and pull-down switching device respectively coupled to a first and second latch node thereof. A first subset of the plurality of sense amplifiers have their first latch node (e.g. latch P-channel "LP") electrically coupled and a second differing number subset of the plurality of sense amplifiers have their second latch node (e.g. latch N-channel "LN") electrically coupled. By sharing the selected LP and LN nodes with more than one sense amplifier in a column, "write" recovery time can be significantly improved over that of conventional layouts and designs.

29 Claims, 8 Drawing Sheets

SHARED SENSE AMPLIFIER DRIVER TECHNIQUE FOR DYNAMIC RANDOM ACCESS MEMORIES EXHIBITING IMPROVED WRITE RECOVERY TIME

BACKGROUND OF THE INVENTION

The present invention relates, in general, to the field of integrated circuit ("IC") memories and devices incorporating dynamic random access memory ("DRAM") arrays. More particularly, the present invention relates to a shared sense amplifier driver technique for such memories and devices which results in a much improved write recovery time over that of conventional layouts.

Many types of DRAM based devices, or integrated circuits including embedded memory arrays, are currently available including extended data out ("EDO"), synchronous DRAM ("SDRAM"), double data rate ("DDR") DRAM and the like. Regardless of configuration, the primary purpose of the DRAM is to store data. Functionally, data may be written to the memory, read from it or periodically refreshed to maintain the integrity of the stored data. In current high density designs, each DRAM memory cell comprises a pass transistor coupled to an associated capacitor that may be charged to store a value representative of either a logic level "1" or "0". Data stored in these memory cells may be read out and written to them through columns of sense amplifiers coupled to complementary bit lines interconnecting rows of these cells.

Certain sense amplifier designs have included cross-coupled complementary metal oxide semiconductor ("CMOS") latches made up of cross coupled inverters comprising series connected P-channel and N-channel transistors. The common connection of the P-channel devices is generally referred to as the latch P-channel ("LP") node while the corresponding common connection of the N-channel devices is denominated the latch N-channel ("LN") node.

Among the possible layouts for columns of such sense amplifiers is to provide a common LP and LN driver device for all of the sense amplifiers. While such an approach may have certain advantages, the LP and LN driver transistors must be very large and the corresponding LP and LN signal lines must be relatively wide. Because of this, relatively slow latching speeds may be experienced resulting in concomitantly slow "read" and "write" speeds. Moreover, data patterns may be encountered which can cause failures such as a logic level "1" in a field of "0s" will tend to latch very late if the number of sense amplifiers in the column is large.

In an attempt to ameliorate certain of these disadvantages, other sense amplifier layouts have incorporated the use of distributed LP and LN drivers in which a relatively smaller pull-up and pull-down transistor is included in each sense amplifier cell instead of much larger devices common to an entire column of sense amplifiers. Through the use of this technique, narrower LPB (latch P-channel bar) and LNB (latch N-channel bar) signal lines may be run vertically to each sense amplifier cell in a column. However, while providing faster "read" speeds than the previously described common LP/LN driver technique (and thinner LPB and LNB signal lines) these designs still exhibit a relatively slow "write" recovery time due to the small size of the single LP driver employed. Moreover, while being somewhat pattern insensitive, these designs also result in a larger on-chip sense amplifier area requirement with individual "read" and "write" column ("Y") selects and data lines being needed.

SUMMARY OF THE INVENTION

In accordance with the shared sense amplifier driver technique of the present invention, by sharing the selected LP and LN nodes with more than one sense amplifier in a column, yet preserving the distributed local LP/LN driver approach, "write" recovery time can be significantly improved over that of conventional layouts and designs.

Broadly, disclosed herein is an integrated circuit device including an array of memory cells which comprises a plurality of sense amplifiers couplable to the memory cells with each of the sense amplifiers having an associated pull-up and pull-down switching device respectively coupled to a first and second latch node thereof. A first subset of the plurality of sense amplifiers have their first latch node electrically coupled and a second differing number subset of the plurality of sense amplifiers have their second latch node electrically coupled.

Further disclosed herein is an integrated circuit device comprising an array of memory cells wherein the array comprises "N" number of sense amplifiers coupled to bit lines of the array and the memory cells with a first plurality of the N sense amplifiers having a common connected pull-up latch node and a second differing number plurality of the N sense amplifiers having a common connected pull-down latch node.

Particularly disclosed in a representative embodiment of the present invention is a sense amplifier layout wherein the LP node is shared among eight sense amplifiers. Through the use of the technique disclosed herein, the P-channel pull-up device is thereby effectively eight times as strong for a "write" recovery mode where only one Y address is valid so that only one of sixteen (or 1 of 32; or 1 of 1024 etc.) columns is being written.

By also sharing the LN node among groups of two sense amplifiers, the N-channel pull-down device is also stronger for a "write" recovery for the same reason. In this exemplary implementation of the present invention, sharing the LN node with two sense amplifiers is a particularly area efficient approach since adjacent sense amplifiers can share the same active area of a transistor with no area penalty. Experimentally, it has been determined that sharing the LN node with eight sense amplifiers may result in a sense amplifier that is too strong and to which "writes" are then rendered more difficult.

Therefore, for the particular embodiment disclosed herein, it has been determined that sharing the LP node with eight sense amplifiers, and the LN node with two, is optimum for the design and technology of the particular embodiment described. The technique disclosed herein is, nevertheless, applicable to differing technologies, designs and sense amplifier sizes such that other LP and LN node sharing relationships would prove to be optimum, (e.g. 4:1 or 16:4) and the ratio of LP node sharing to LN node sharing can be optimized for a particular design.

Fundamentally, it would desirable to share the maximum number of LN and LP drivers without encountering a pattern sensitivity area. Since N-channel devices are stronger than correspondingly sized P-channel devices (even without ideally simultaneous sensing), the N-channel pull-down transistors effectively do more of the sensing and latching. Since "writes" are effectively a "pull-down" on one data write ("DW") line (a double high on the DW and complementary data write bar ("DWB")line is a "write mask") the P-channel transistors are more important for a "write" restore operation. Consequently, a differing number of shared LN nodes and LP nodes has been found to be optimum.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
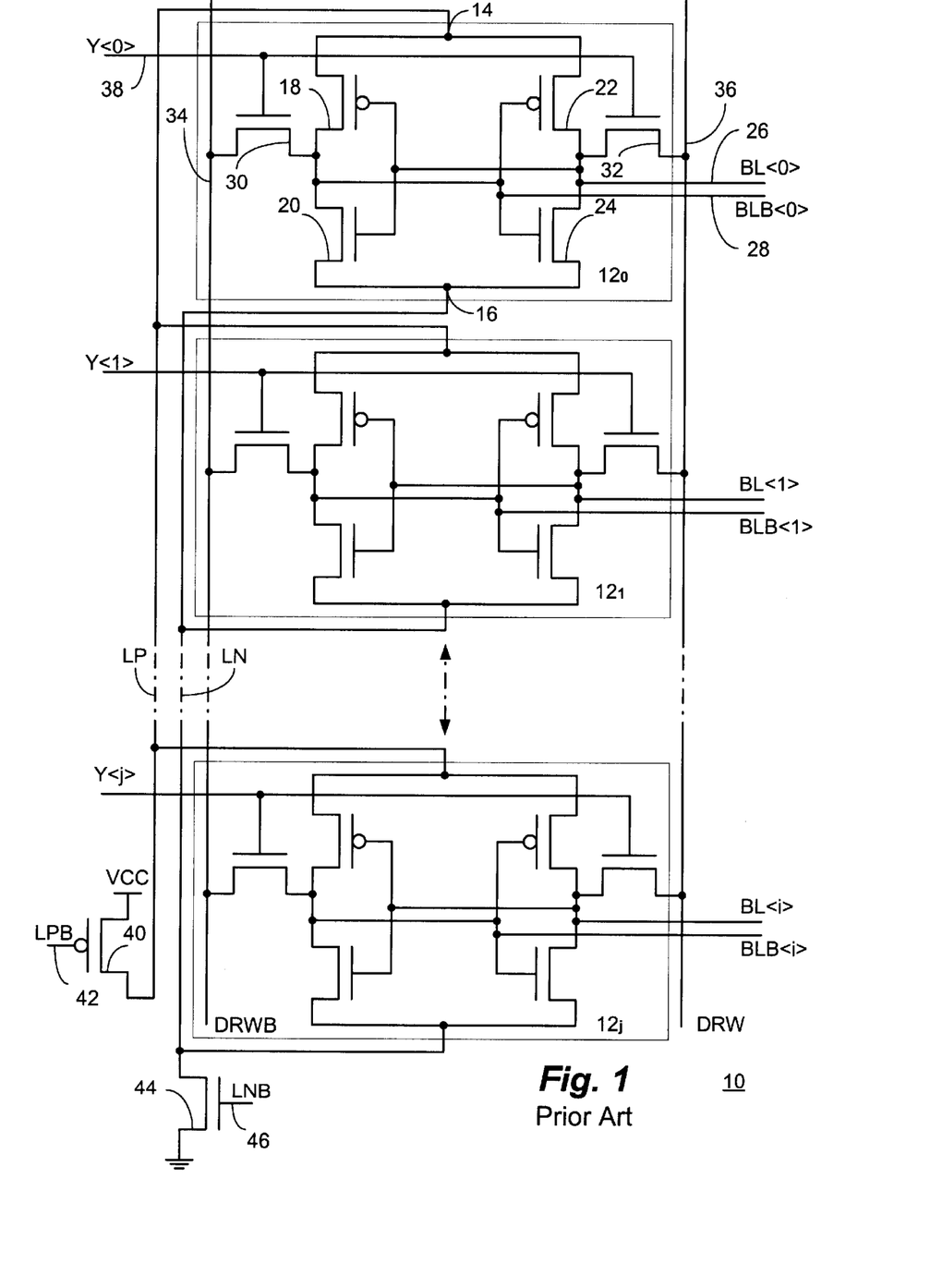
FIG. 1 is a schematic illustration of a prior art layout of a column of sense amplifiers which requires relatively wide LN and LP signal lines as well as relatively large LN and LP drivers to drive these lines.

With reference now to FIG. 1, a schematic illustration of a particular prior art layout for a column 10 of sense amplifiers $12_0$ through $12_j$ is shown in which relatively wide LP and LN signal lines 14, 16 are required as well as relatively large LN and LP drivers to drive these lines.

Each of the sense amplifiers 12 comprise a latch made up of a pair of cross-coupled CMOS inverters coupled between the LP and LN signal lines 14, 16 respectively. P-channel transistor 18 in series with N-channel transistor 20 comprises a first inverter while P-channel transistor 22 in series with N-channel transistor 24 comprises a second. The output node of the second inverter is coupled to bit line ("BL") BL<0:i> 26 while the output node of the first inverter is coupled to bit line bar ("BLB") BLB<0:i> 28.

An N-channel transistor 30 selectively couples the BLB<0:1> line 28 to data read/write bar ("DRWB") line 34 depending on the state of the column select signal on Y<0:i> line 38 while N-channel transistor 32 selectively couples the BL<0:i> line 26 to the data read/write ("DRW") line 36 in response to the same signal. A relatively large P-channel transistor 40 couples a supply voltage source VCC to the relatively wide LP line 14 in response to the latch P-channel bar ("LPB") signal on line 42 coupled to its gate terminal. Similarly, a relatively large N-channel transistor 44 couples the relatively wide LN line 16 to circuit ground ("VSS") in response to the latch N-channel bar ("LNB") signal on line 46 coupled to its gate terminal.

Among the problems inherent in this design is that the LN and LP signal lines to the nodes 16 and 14 need to be very wide while the corresponding LN and LP drivers 44, 40 are also very large in order to drive an entire column of sense amplifiers 12. Further, because of their relatively slow latching speed, the "read" and "write" times are also slow. Moreover, as previously noted, data patterns may be encountered that cause failures such as a logic level "1" in a field of "0s" will latch very late if the number of sense amplifiers 12 is large.

Figure 2A:
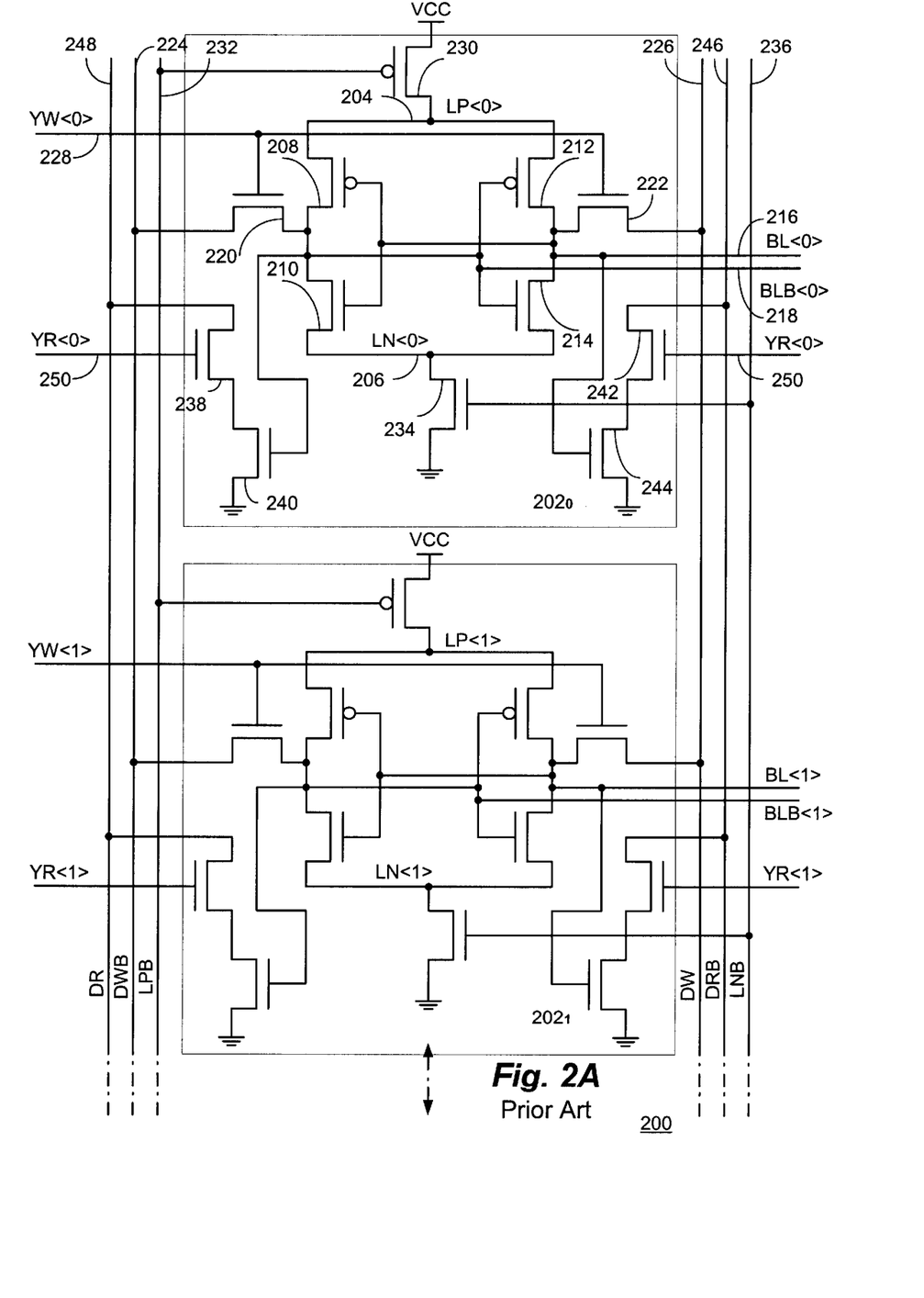
FIGS. 2A and 2B are a schematic illustration of another prior art layout of a column of sense amplifiers which addresses some of the deficiencies of the design of the preceding figure yet still exhibits a relatively slow "write" recovery time due to the use of a small, single LP driver per sense amplifier.
Figure 2B:
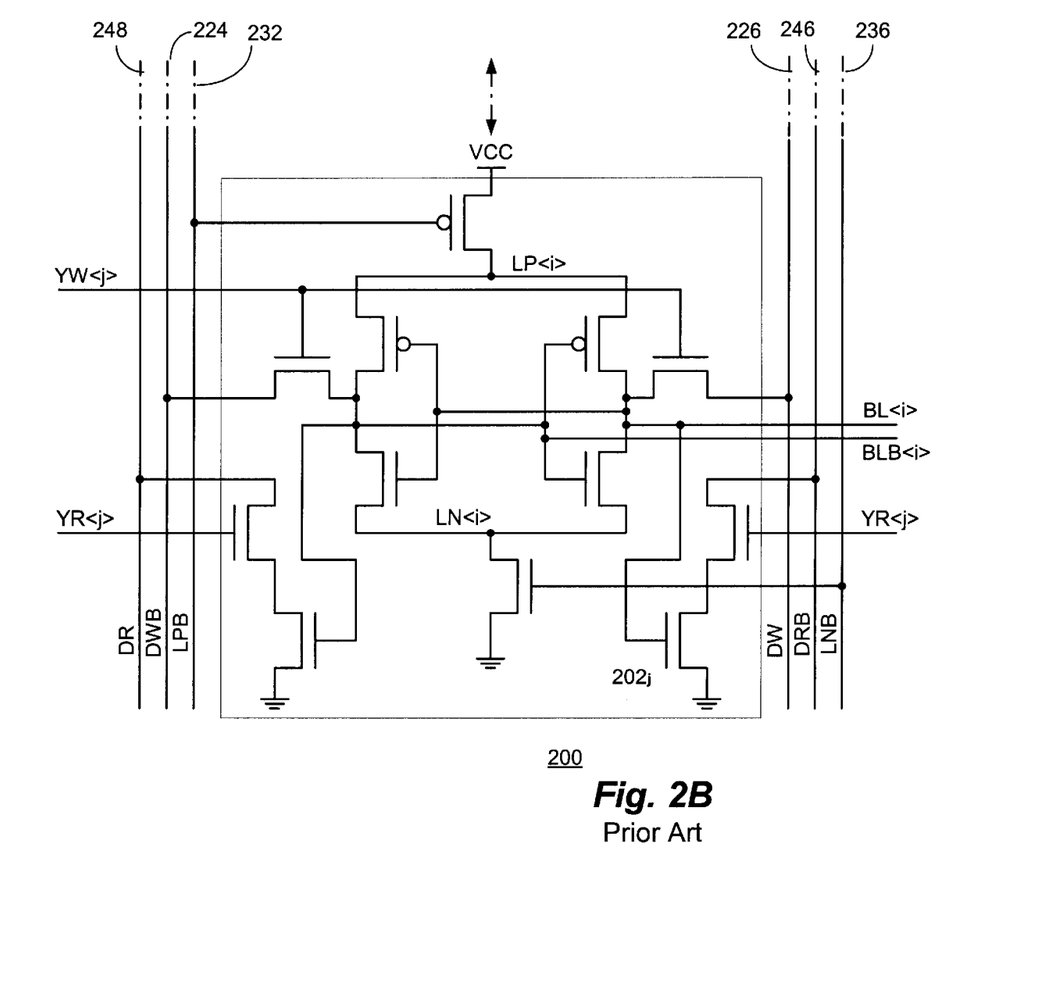

With reference additionally now to FIGS. 2A and 2B, a schematic illustration of another prior art layout of a column 200 of sense amplifiers $202_0$ through $202_j$ is shown. The sense amplifier 202 layout illustrated addresses some of the deficiencies of the design of the preceding FIG. 1 yet still exhibits a relatively slow "write" recovery time due to the use of a small, single LP driver.

Each of the sense amplifiers 202 includes a latch comprising a pair of cross-coupled CMOS inverters coupled between an LP<0:i> node 204 and an LN<0:i> node 206. A first inverter comprises series connected P-channel transistor 208 and N-channel transistor 210 while a second inverter comprises series connected P-channel transistor 212 and N-channel transistor 214. The output node of the second inverter is coupled to BL<0:i> line 216 while the output node of the first inverter is coupled to BLB<0:i> line 218.

An N-channel transistor 220 selectively couples the BLB<0:i> line 218 to DWB line 224 depending on the state of the signal column write signal YW<0:j> on line 228. Similarly, N-channel transistor 222 selectively couples the BL<0:i> line 216 to DW line 226 in response to the same signal. A P-channel transistor 230 couples the LP<0:i> nodes 204 to VCC depending on the state of the signal on LPB line 232 while an N-channel transistor 234 selectively couples the LN<0:i> nodes 206 to VSS depending on the state of the signal on LNB line 236.

Series connected N-channel transistors 238 and 240 couple the DR line 248 to VSS, with the gate of transistor 238 being coupled to receive a column write signal YR<0:j> signal on line 250 and the gate of transistor 240 being coupled to BLB<0:i> line 218. In like manner, series connected N-channel transistors 242 and 244 couple the DRB line 246 to VSS, with the gate of transistor 242 being coupled to receive the YR<0:j> signal on line 250 and the gate of transistor 244 being coupled to BL<0:i> line 216.

In this design, a relatively small latch N-channel transistor 234, together with a relatively small latch P-channel transistor 230 is distributed throughout the sense amplifier column 200 by placing one in each of the sense amplifier 202 cells and the LPB and LNB signal lines 232, 236 are run vertically to each sense amplifier 202.

Among the advantages of this particular design is that there is no perceptible pattern sensitivity to the cell design, the "read" speed is faster than that exhibited by the design of FIG. 1 and the LNB and LPB signal lines 236, 232 can be made thinner than the latter's LN and LP lines as well. Nevertheless, this design still exhibits a relatively slow "write" recovery time due to the small, single LP driver and requires a relatively larger sense amplifier area. Further, individual "read" and "write" column select signals and data lines are needed. Moreover, because each sense amplifier has its own LN and LP driver and the LN/LP nodes 206, 204 are individual to each sense amplifier, there may be too little drive per sense amplifier 202 during "reads" which can result in a disturb if the "reads" were done with a simple pass gate as in the design shown in FIG. 1. Consequently, a "read" preamplifier is required with the four extra devices (transistors 238, 240, 242 and 244) shown.

Figure 3A:
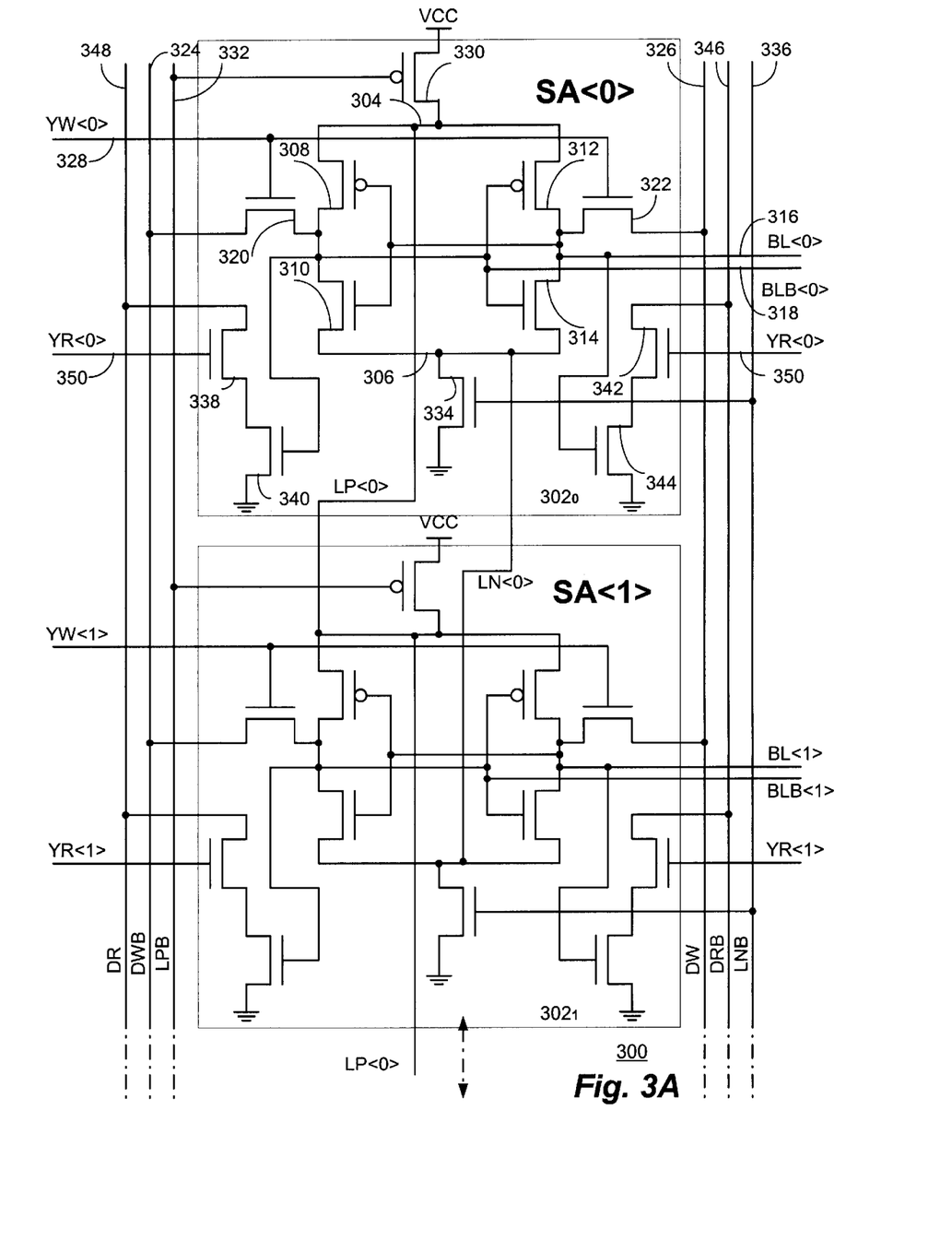
FIGS. 3A and 3B are a schematic illustration of a representative implementation of a column of sense amplifiers embodying the technique of the present invention which results in a faster "write" recovery time due to the sharing of the LN node between two sense amplifiers and the LP node with eight sense amplifiers.
Figure 3B:
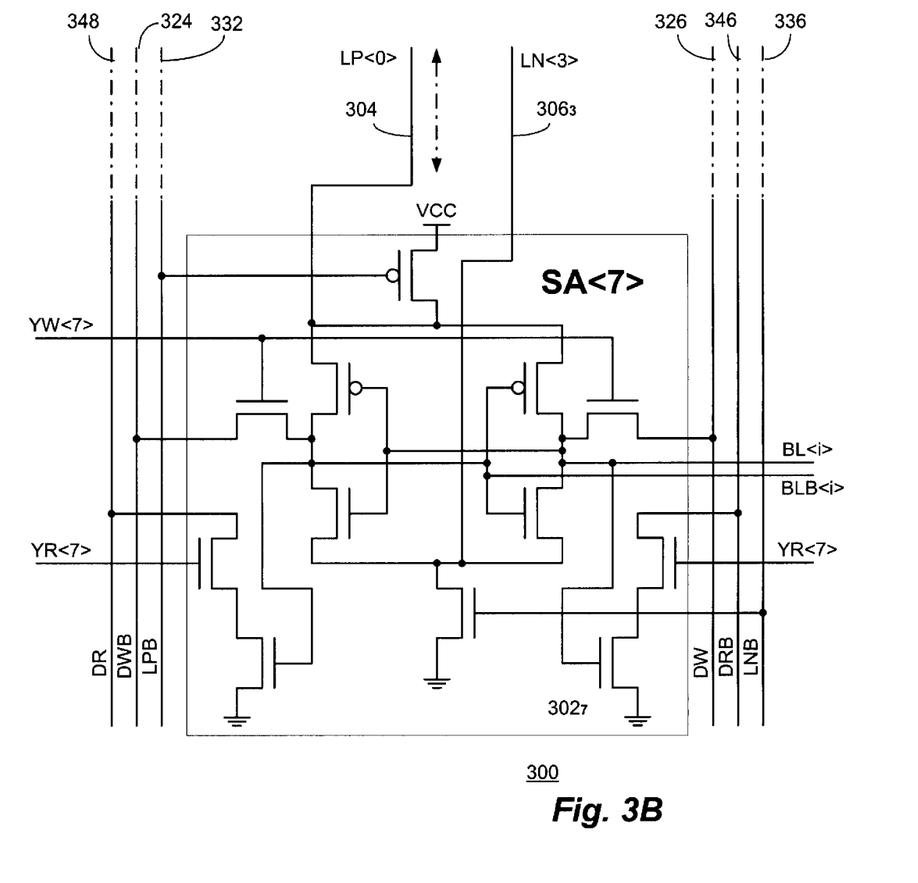

With reference additionally now to FIGS. 3A and 3B, a schematic illustration of a representative implementation of a column 300 of sense amplifiers $302_0$ through $302_7$ (SA<0> through SA<7>) is shown embodying the technique of the present invention which results in a faster "write" recovery time due to the sharing of the LN node with two sense amplifiers and the LP node with eight sense amplifiers.

Each of the sense amplifiers 302 again includes a latch comprising a pair of cross-coupled CMOS inverters coupled between an LP<0> node 304 and an LN<0:3> nodes 306. A first inverter comprises series connected P-channel transistor 308 and N-channel transistor 310 while a second inverter comprises series connected P-channel transistor 312 and N-channel transistor 314. The output node of the second inverter is coupled to BL<0:i> line 316 while the output node of the first inverter is coupled to BLB<0:i> line 318.

An N-channel transistor 320 selectively couples the BLB<0:i> line 318 to DWB line 324 depending on the state of the signal YW<0:7> on line 328. Similarly, N-channel transistor 322 selectively couples the BL<0:i> line 316 to DW line 326 in response to the same signal. A P-channel transistor 330 couples the LP<0> node 304 to VCC depending on the state of the signal on LPB line 332 while an N-channel transistor 334 selectively couples the LN<0:3> nodes 306 to VSS depending on the state of the signal on LNB line 336.

Series connected N-channel transistors 338 and 340 couple the DR line 348 to VSS, with the gate of transistor 338 being coupled to receive a YR<0:7> signal on line 350 and the gate of transistor 340 being coupled to BLB<0:i> line 318. In like manner, series connected N-channel transistors 342 and 344 couple the DRB line 346 to VSS, with the gate of transistor 342 being coupled to receive the YR<0:7> signal on line 350 and the gate of transistor 344 being coupled to BL<0:i> line 316.

In this particular exemplary implementation of the present invention, the LN node 306 is shared between every two contiguous sense amplifiers 302 and the LP node 304 is shared with all eight sense amplifiers $302_0$ through $302_7$. This serves to ameliorate the slow "write" recovery time of the prior art design of FIGS. 2A and 2B while maintaining all of the advantages inherent in that layout. Experimentally, the "write" recovery speed has been determined to be improved by on the order of 300 picoseconds.

Figure 4:
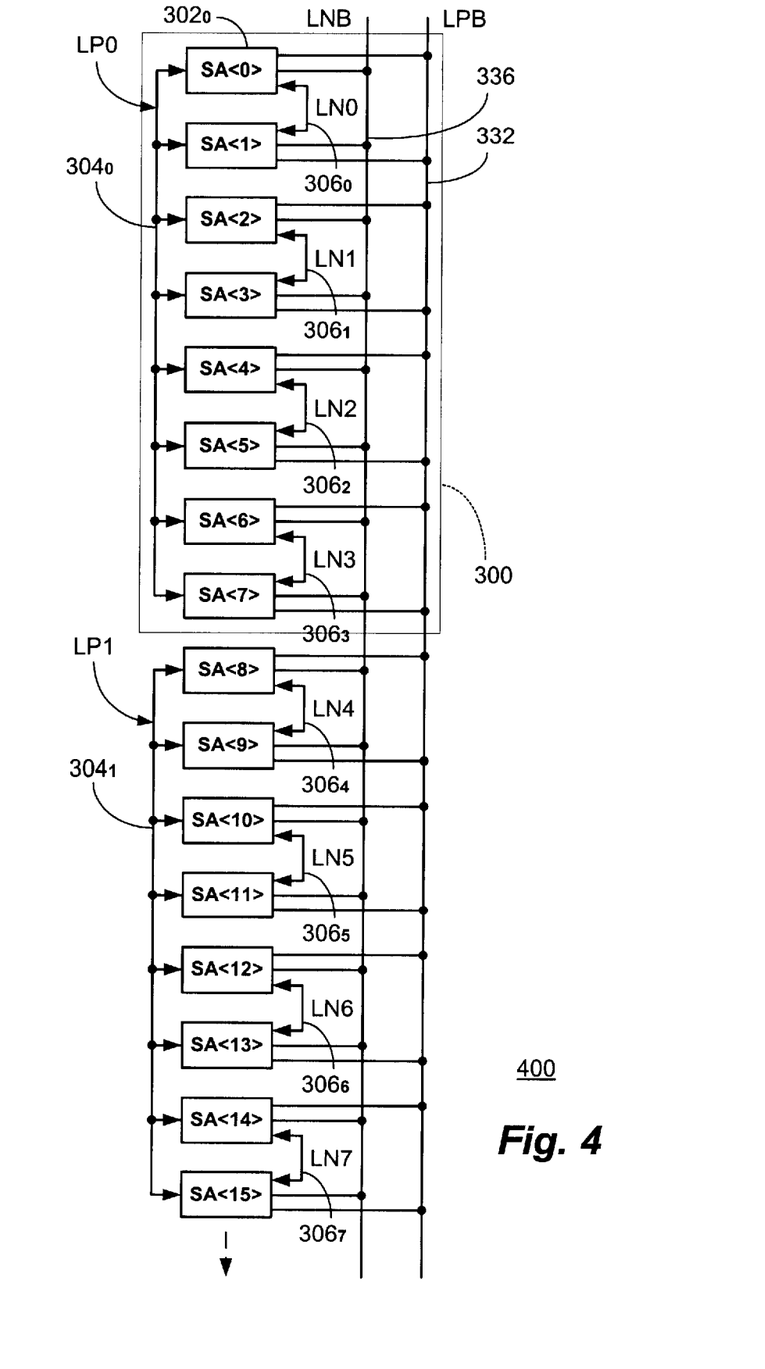
FIG. 4 is a higher level logic block illustration of a column of sense amplifiers, a portion of which was previously illustrated in more detail in FIGS. 3A and 3B.

With reference additionally now to FIG. 4, a higher level logic block illustration of a column 400 of sense amplifiers 302 is shown, a portion of which was previously illustrated in more detail in the preceding FIGS. 3A and 3B.

In this exemplary implementation of the present invention, sixteen or more sense amplifiers 302 (labeled SA<0> through SA<15> inclusive) may be included, grouped into a number of subset columns 300 of eight sense amplifiers (e.g. SA<0> through SA<7> inclusive. In each of the columns, the LP node $304_0$ (LP0) is common to all sense amplifiers 302 in that subset while the LN node 306 is common connected between each subset of two of the sense amplifiers 302 as shown. Thus, in this representative embodiment of the present invention, eight sense amplifiers $302_0$ through $302_7$ have a common connected LP node $304_0$ while sense amplifiers $302_0$ and $302_1$ (SA<0> and SA<1>) have a common LN node $306_0$; sense amplifiers $302_2$ and $302_3$ (SA<2> and SA<3>) have a common LN node $306_1$, sense amplifiers $302_4$ and $302_5$ (SA<4> and SA<5>) have a common LN node $306_2$; and sense amplifiers $302_6$ and $302_7$ (SA<6> and SA<7>) have a common LN node $306_3$.

In like manner, another subset of the sense amplifiers 302 may have a common connected LP node 304, (LP1) as shown with similarly grouped subsets of sense amplifiers 302 with common LN nodes $306_4$ through $306_7$. It should be noted that other groupings of sense amplifiers 302 with common connected LP nodes 304 and LN nodes 306 are possible without departing from the spirit and scope of the present invention and is dependent upon the particular design, device sizes and process technologies employed.

Figure 5A:
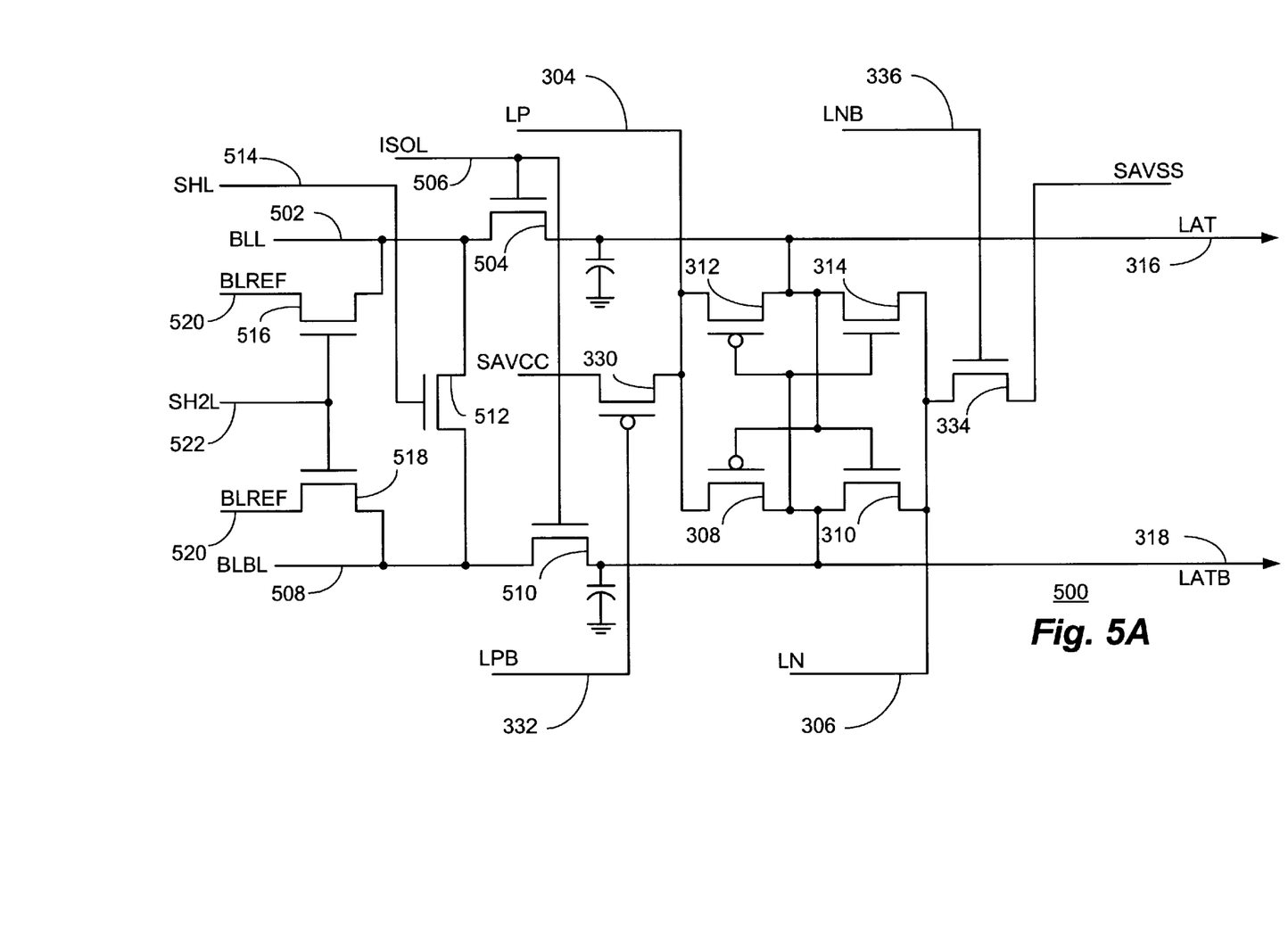
FIGS. 5A and 5B together are a schematic illustration of a particular DRAM array column circuit employing the sense amplifier driver technique as shown in FIGS. 3A, 3B and 4.
Figure 5B:
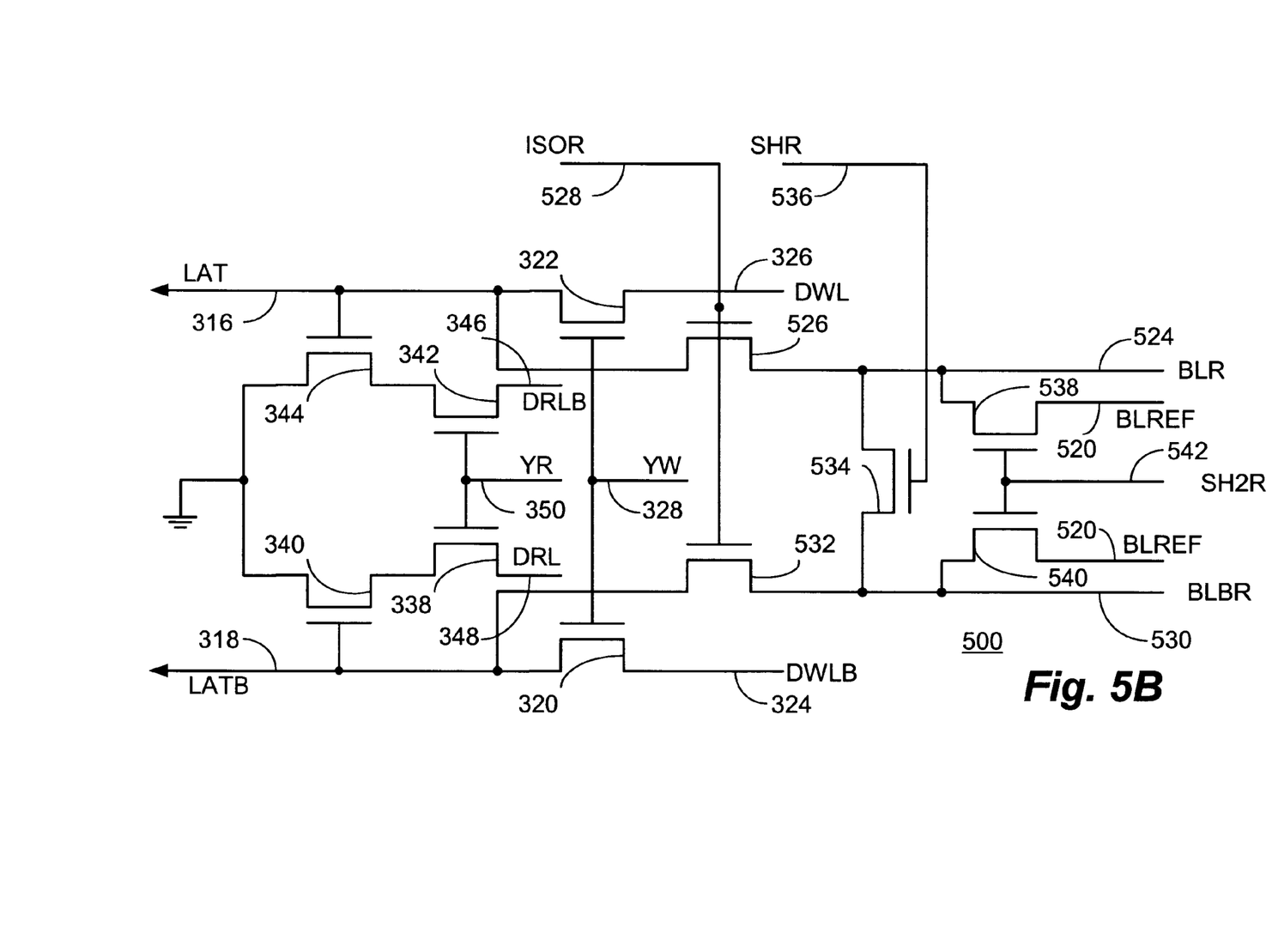

With reference additionally now to FIGS. 5A and 5B, a schematic illustration of a particular DRAM array column circuit 500 is shown in which the sense amplifier driver technique as shown in FIGS. 3A, 3B and 4 is employed. With respect to these figures, like components, structure and devices to that previously described is like numbered and the foregoing description thereof shall suffice herefor.

With reference to FIG. 5A in particular, the circuit 500 comprises, as shown, a CMOS latch made up of transistors 308, 310, 312 and 314 as previously described. As also disclosed previously, the LP node 304 is selectively couplable to a supply voltage source (in this embodiment illustrated as "SAVCC") by means of transistor 330 which has its gate terminal coupled to receive the LPB signal on line 332. Similarly, the LN node 306 is selectively couplable to a reference voltage source (in this embodiment illustrated as "SAVSS") by means of transistor 334 which has its gate terminal coupled to receive the LNB signal on line 336.

The output nodes of the CMOS latch are coupled to the complementary bit lines 316 and 318 here labeled "LAT" (latch) and "LATB" (latch bar) respectively and are selectively isolated from the bit line ("BLL") and bit line bar ("BLBL") lines 502 and 508 by means of N-channel transistors 504 and 510 respectively in response to the state of an isolation ("ISOL") signal on line 506. The BLL line 502 and BLBL line 508 may be selectively coupled together by means of N-channel transistor 512 in response to an SHL signal on line 514 and individually coupled to a bit line reference ("BLREF") signal on line 520 through N-channel transistors 516 and 518 respectively in response to an SH2L signal on line 522 coupled to their gate terminal.

With respect to FIG. 5B in particular, the circuit 500 includes the "read" circuitry comprising transistors 338, 340, 342 and 344 coupled between the bit lines 316 and 318 and the data read ("DRL" or "DR") and data read bar ("DRLB" or "DRB") lines 348, 346 previously described as controlled by the column read ("YR") signal on line 350. The "write" circuitry comprises transistors 320 and 322 controlled by the column write ("YW") signal on line 328 for coupling the bit lines 316, 318 to the data write ("DWL" or "DW") and data write bar ("DWLB" or "DWB") lines 326, 324.

A pair of N-channel transistors 526 and 532 are operative to isolate the bit lines 316 and 318 from the bit line ("BLR") and bit line bar ("BLBR") lines 524 and 530 respectively in response to an isolate ("ISOR") signal on line 528. The BLR line 524 and BLBR line 530 may be selectively coupled together by means of N-channel transistor 534 in response to an SHR signal on line 536 and individually coupled to the BLREF signal on line 520 through N-channel transistors 534 and 540 respectively in response to an SH2R signal on line 542 coupled to their gate terminal.

What has been provided, therefore, is a shared sense amplifier driver technique for integrated circuit devices including an array of memory cells which comprises a plurality of sense amplifiers couplable to the memory cells with each of the sense amplifiers having an associated pull-up and pull-down switching device respectively coupled to a first and second latch node thereof. A first subset of the plurality of sense amplifiers have their first latch node (e.g. latch P-channel "LP") electrically coupled and a second differing number subset of the plurality of sense amplifiers have their second latch node (e.g. latch N-channel "LN") electrically coupled. By sharing the selected LP and LN nodes with more than one sense amplifier in a column, "write" recovery time can be significantly improved over that of conventional layouts and designs.

While there have been described above the principles of the present invention in conjunction with specific sense amplifier configurations, semiconductor technology and the like it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit device including an array of memory cells comprising:
    a plurality of sense amplifiers couplable to said memory cells, each of said sense amplifiers having an associated pull-up and pull-down switching device respectively coupled to a first and second latch node thereof;
    wherein a first subset of said plurality of sense amplifiers have said first latch node electrically coupled and a second differing number subset of said plurality of sense amplifiers have said second latch node electrically coupled.

2. The integrated circuit device of claim 1 wherein said array of memory cells comprises dynamic random access memory.

3. The integrated circuit device of claim 1 wherein said sense amplifiers comprise a CMOS latch.

4. The integrated circuit device of claim 3 wherein said CMOS latch includes first and second output nodes thereof respectively coupled to first and second complementary bit lines of said memory array.

5. The integrated circuit device of claim 4 wherein said first and second output nodes are selectively couplable to complementary first and second data write lines in response to a write control signal.

6. The integrated circuit device of claim 4 further comprising complementary first and second data read lines for respectively indicating a state of said first and second output nodes of said CMOS latch in response to a read control signal.

7. The integrated circuit device of claim 3 wherein said pull-up device comprises a P-channel transistor for selectively coupling said first latch node to a supply voltage source.

8. The integrated circuit device of claim 7 wherein a gate terminal of said P-channel transistor is coupled to receive a latch P-channel signal.

9. The integrated circuit device of claim 3 wherein said pull-down device comprises an N-channel transistor for selectively coupling said second latch node to a reference voltage source.

10. The integrated circuit device of claim 9 wherein a gate terminal of said N-channel transistor is coupled to receive a latch N-channel signal.

11. The integrated circuit device of claim 1 wherein said first subset of said plurality of sense amplifiers is greater than said second subset of said plurality of sense amplifiers.

12. The integrated circuit device of claim 11 wherein said first subset of sense amplifiers comprises eight sense amplifiers.

13. The integrated circuit device of claim 11 wherein said second subset of sense amplifiers comprises two sense amplifiers.

14. An integrated circuit device comprising an array of memory cells, said array comprising:
    N integer number of sense amplifiers coupled to bit lines of said array and said memory cells;
    a first plurality of said N sense amplifiers having a common connected pull-up latch node; and
    a second differing number plurality of said N sense amplifiers having a common connected pull-down latch node.

15. The integrated circuit device of claim 14 wherein said first plurality of said N sense amplifiers is greater than said second plurality of said N sense amplifiers.

16. The integrated circuit device of claim 14 wherein said first plurality of said N sense amplifiers comprises X integer multiple of four sense amplifiers and said second plurality of said N sense amplifiers comprises X/4 sense amplifiers.

17. The integrated circuit device of claim 14 wherein said first plurality of said N sense amplifiers comprises eight sense amplifiers.

18. The integrated circuit device of claim 14 wherein said second plurality of said N sense amplifiers comprises two sense amplifiers.

19. The integrated circuit device of claim 14 wherein said pull-up latch node comprises an LP node and said pull-down latch node comprises an LN node.

20. The integrated circuit device of claim 14 wherein each of said N sense amplifiers comprise a CMOS latch.

21. An integrated circuit device including an array of memory cells comprising:
    a plurality of sense amplifiers, each of said sense amplifiers comprising a CMOS latch having complementary output nodes and opposing pull-up and pull-down nodes thereof, said output nodes being coupled to complementary bit lines coupled to said array of memory cells;
    a first switching device associated with each of said plurality of sense amplifiers for selectively coupling said pull-up node to a supply voltage source in response to a first control signal; and
    a second switching device associated with each of said plurality of sense amplifiers for selectively coupling said pull-down node to a reference voltage source in response to a second control signal;
    said pull-up nodes of a first subset of said plurality of sense amplifiers being common connected and said pull-down nodes of a second differing number subset of said first subset of said plurality of being common connected.

22. The integrated circuit device of claim 21 wherein said array of memory cells comprises dynamic random access memory.

23. The integrated circuit device of claim 21 wherein said first switching device comprises a P-channel transistor.

24. The integrated circuit device of claim 23 wherein a gate terminal of said P-channel transistor is coupled to receive a latch P-channel signal.

25. The integrated circuit device of claim 21 wherein said second switching device comprises an N-channel transistor.

26. The integrated circuit device of claim 25 wherein a gate terminal of said N-channel transistor is coupled to receive a latch N-channel signal.

27. The integrated circuit device of claim 21 wherein said first subset of said plurality of sense amplifiers is greater than said second differing number subset of said plurality of sense amplifiers.

28. The integrated circuit device of claim 27 wherein said first subset of sense amplifiers comprises eight sense amplifiers.

29. The integrated circuit device of claim 28 wherein said second differing number subset of sense amplifiers comprises two sense amplifiers.

* * * * *